United States Patent [19]
Shimoi et al.

[11] 3,944,862
[45] Mar. 16, 1976

[54] X-CUT QUARTZ RESONATOR USING NON OVERLAPING ELECTRODES

[75] Inventors: Akio Shimoi, Suwa; Kikuo Oguchi, Yashirohigashi; Toshiaki Ogata, Suwa, all of Japan

[73] Assignee: Kabushiki Kaisha Suwa Seikosha, Tokyo, Japan

[22] Filed: May 2, 1974

[21] Appl. No.: 466,587

[30] Foreign Application Priority Data
May 2, 1973   Japan.............................. 48-49359

[52] U.S. Cl. .................. 310/9.8; 310/8.2; 310/9.6; 310/9.7; 310/9.5
[51] Int. Cl. ........................................... H01l 41/08
[58] Field of Search ............... 310/8.2, 9.5, 9.6, 9.7, 310/9.8; 58/23 TF, 23 V

[56] References Cited
UNITED STATES PATENTS

| | | |
|---|---|---|
| 2,081,405 | 5/1937 | Mason ............................ 310/9.8 X |
| 2,262,966 | 11/1941 | Rohde................................ 310/9.8 |
| 2,373,431 | 4/1945 | Sykes.............................. 310/9.8 X |
| 3,128,397 | 4/1964 | Shinada et al. .................. 310/9.8 X |
| 3,408,515 | 10/1968 | Morse ............................ 310/9.8 X |
| 3,614,483 | 10/1971 | Berlincourt..................... 310/9.8 X |
| 3,683,213 | 8/1972 | Staudte ........................... 310/8.2 X |

*Primary Examiner*—Mark O. Budd
*Attorney, Agent, or Firm*—Blum, Moscovitz, Friedman & Kaplan

[57] ABSTRACT

A flexural mode quartz crystal vibrator formed from a quartz crystal plate having first and second opposed substantially planar surfaces, with a plurality of electrodes on both said surfaces is provided. The vibrator is characterized by the placement of electrodes on both of the opposed surfaces so that the electrodes on each surface do not overlap each other.

10 Claims, 11 Drawing Figures

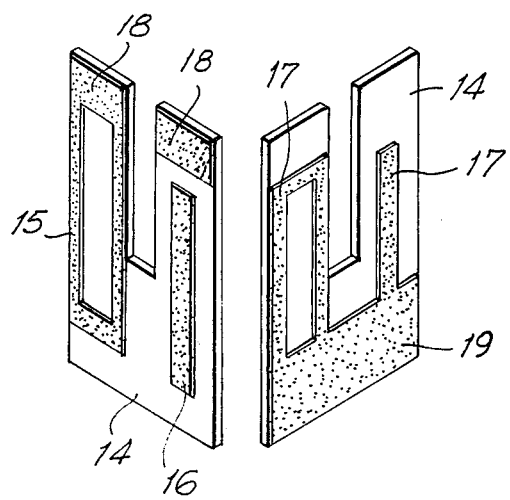
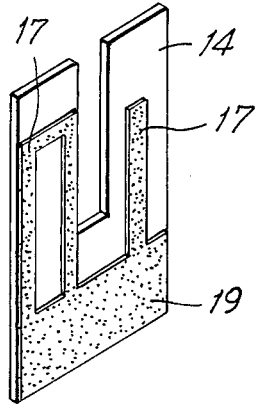
FIG. 7a  FIG. 7b
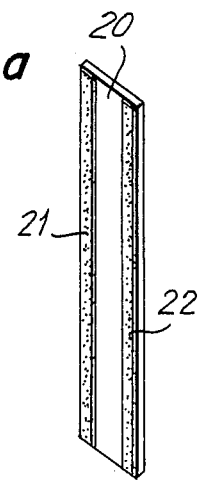
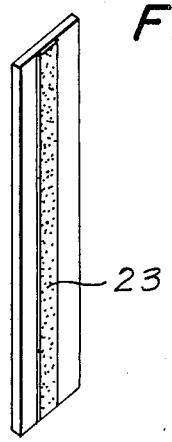
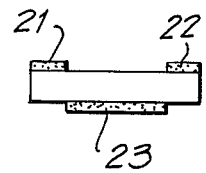
FIG. 8a  FIG. 8b  FIG. 9

3,944,862

X-CUT QUARTZ RESONATOR USING NON OVERLAPING ELECTRODES

BACKGROUND OF THE INVENTION

This invention is directed to a flexural mode quartz crystal vibrator and in particular to the placement of electrodes on a quartz crystal plate to improve the utility of a quartz crystal vibrator by reducing the thickness and improving the operation thereof.

Recently, quartz crystal watches have been developed that are practically priced to compete with mechanical watches and the development, manufacture and sales thereof have rapidly accelerated. Such quartz crystal timepieces utilize quartz crystal vibrators to provide a high frequency time standard signal. The quartz crystal vibrators are operated in the flexural mode of vibration, namely, the free-free-bar type or the tuning fork type. Both type flexural mode vibrators utilize a +5° X-cut or a NT-cut quartz crystal plate formed by conventional mechanical process such as diamond wheel cutting, supersonic cutting or the like.

A recent development in manufacturing quartz crystal plates is the chemical processing of a quartz crystal by photoetching the electrodes onto the quartz crystal plate. Such photo-etching has heretofore been only utilized with NT-cut quartz crystal, such flexural mode vibrators formed with a chemically processed NT-cut quartz crystal plate having been disclosed in Japanese Pat. No. 48-3575. X-cut quartz crystal vibrators facilitate the connection thereof into an oscillator circuit due to their low dynamic impedance. Further, they permit precise adjustment of the operating point of an oscillator circuit due to their stabilized flexion-point temperature characteristics at room temperature. However, such mechanically cut quartz crystal plates have heretofore been formed of a thickened crystal plate. The thickness of the crystal plate does not recommend such X-cut quartz crystal plates to an electronic timepiece wherein minimal space requirements are essential. Similarly, although NT-cut flexural quartz crystal vibrators have included small-sized quartz crystal plates which are much thinner than X-cut plates, the dynamic impedance of the NT-cut plates is extremely high and the temperature-resonance frequency characteristic at room temperature is volatile, thereby rendering same less than completely satisfactory.

SUMMARY OF THE INVENTION

Generally speaking, in accordance with the invention, a flexural mode quartz crystal vibrator comprising a quartz crystal plate having a first and second opposed substantially planar surface is provided. A plurality of electrodes are disposed on both said opposed surfaces of the quartz crystal plate in a non-overlapping arrangement to thereby provide an improved flexural mode vibrator.

Accordingly, it is an object of this invention to provide an improved flexural mode quartz crystal vibrator having minimal thickness.

It is another object of this invention to provide an improved flexural mode quartz crystal vibrator having an X-cut quartz crystal plate.

It is still another object of this invention to provide an improved quartz crystal vibrator having a minimal thickness yet admitting of a highly efficient operation.

It will thus be seen that the objects set forth above, among those made apparent from the preceding description, are efficiently attained and, since certain changes may be made in the above constructions without departing from the spirit and scope of the invention, it is intended that all matter contained in the above description or shown in the accompanying drawings shall be interpreted as illustrative and not in a limiting sense.

It is also to be understood that the following claims are intended to cover all of the generic and specific features of the invention herein described, and all statements of the scope of the invention which, as a matter of language, might be said to fall therebetween.

BRIEF DESCRIPTION OF THE DRAWINGS

FIGS. 7a and 7b are perspective views of the front and back surfaces, respectively, of a tuning fork flexural mode quartz crystal vibrator constructed in accordance with the instant invention;

FIGS. 8a and 8b are perspective views of the front and back surfaces of a free-free-bar flexural mode quartz crystal vibrator constructed in accordance with the instant invention and FIG. 9 is a sectional view of the vibrator depicted in FIGS. 8a and 8b.

DETAILED DESCRIPTION OF THE PREFERRED EMBODIMENTS

Figure 1:
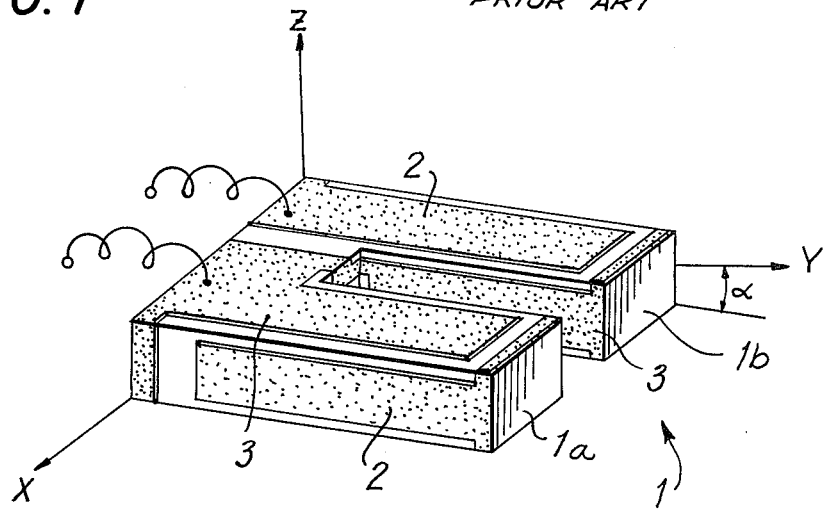
FIG. 1 is a perspective view of a tuning fork quartz crystal vibrator constructed in accordance with the prior art.
Figure 2:
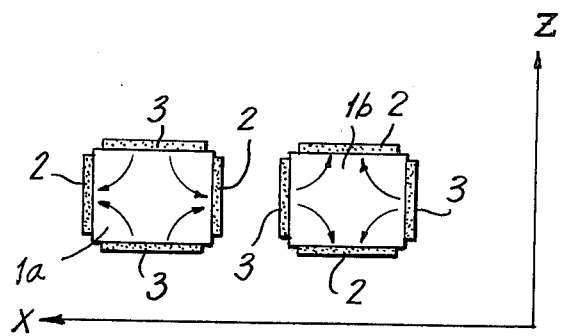
FIG. 2 is a sectional view of the quartz crystal vibrator depicted in FIG. 1.

Reference is now made to FIGS. 1 and 2, wherein a prior art +5° X-cut tuning fork flexural-mode quartz crystal vibrator 1 formed by well-known mechanical processes is depicted. The tuning fork vibrator 1, as well as the other representations included in FIGS. 3 through 9 are illustrated with reference to the X, Y and Z axes, which represent the electrical, mechanical and optical axes of the quartz crystal plate, respectively. Quartz crystal vibrator 1 is formed from an X-cut plate which is obtained by rotating a Z-cut plate around the X axis by an angle $\alpha$, which angle $\alpha$ is in the range of 0° to 10°, the angle most often selected equalling 5°. A first plurality of electrodes 2 are disposed on the sides of a first line 1a and are disposed on the top and bottom surfaces of a second tine 1b. Assuming that alternating positive and negative pulses are applied to electrodes 2 and 3, the electric fields depicted by the curved arrows in FIG. 2 are generated within the quartz crystal tines. The transverse components of the electric fields, namely, the components in the direction of the electrical X axis, effect a stress in the quartz crystal. In accordance with the electrode configuration depicted in FIG. 2, the X-axis components of the electric fields have a different direction in each tine. Accordingly, when an expansive stress is effected in one tine, a contractive stress is caused in the other tine. Thus, a symmetrical flexural vibration is effected in the quartz crystal vibrator in the plane defined by the top and bottom surfaces when the alternating current is applied to the electrodes. Such X-cut quartz crystal vibrators have become popular in electronic timepiece oscillator circuits because the dynamic impedance thereof is low, thereby rendering same easily connected to an oscillator circuit. Also X-cut quartz crystal vibrators provide a highly precise time standard signal because the temperature-resonance frequency at room temperatures yields a stabilized flexion point. The efficiency of the X-cut crystal vibrator is caused by the transverse stress components generated by electrodes disposed on the sides of the tines. The thickness of such X-cut quartz crystal vibrators is increased by the placement of electrodes on the sides of the quartz crystal plate. Accordingly, it is impossible to provide a quartz crystal vibrator in a flexural mode having the thickness of 0.5 mm or less when electrodes are disposed on the sides thereof. Moreover, to obtain such a thin plate is rendered more difficult since the cutting of a quartz crystal vibrator into the shape of a tuning fork is achieved by a mechanical processing method such as a diamond wheel cutter, supersonic cutter or the like.

Figure 3:
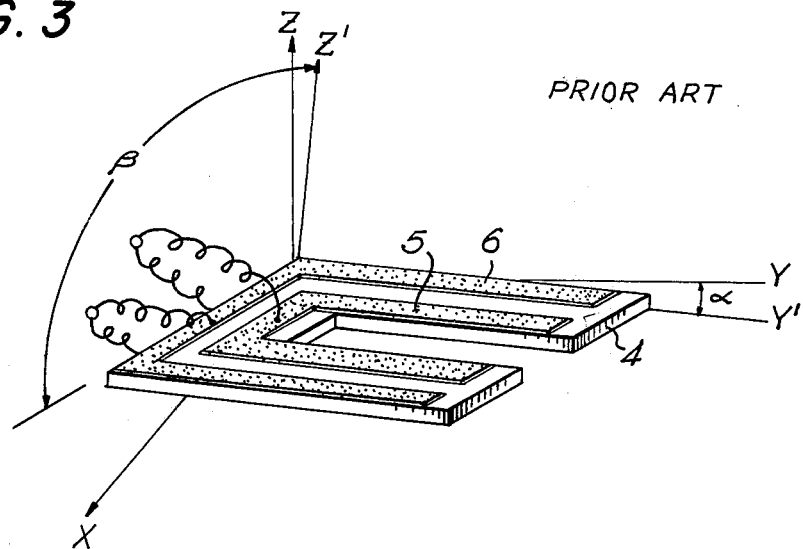
FIG. 3 is an NT-cut quartz crystal vibrator constructed in accordance with the prior art.
Figure 4:
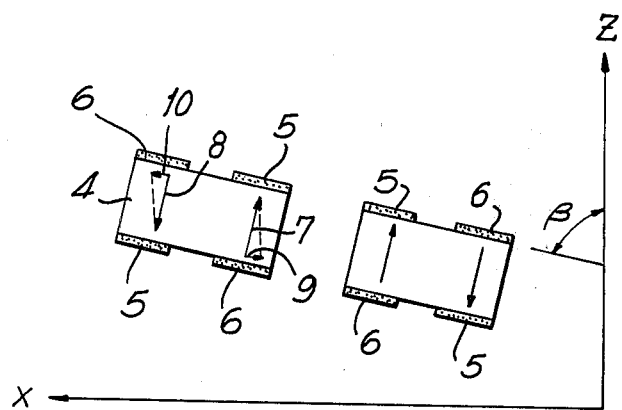
FIG. 4 is a sectional view of the vibrator depicted in FIG. 3.

Referring now to FIGS. 3 and 4, an NT-cut tuning fork flexural-mode quartz crystal vibrator 4 manufactured by a conventional chemical process is depicted. The thickness of the tuning fork as illustrated in FIG. 4 is exaggerated in order to more clearly explain same, it being noted that the actual thickness thereof is very thin by comparison to the width of each tine. In order to simplify the drawing, the angle $\alpha$ is set for 0° about the X axis, it being noted that $\alpha$ is in the range of 0°–10°. The tuning fork flexural-mode quartz crystal vibrator 4 has an electrode 5 on the inner periphery of the top surface of each of the tines and an outer peripheral electrode 6 disposed on the outer periphery of the top surface of each of the tines. However, on the bottom surface of the quartz crystal plate the electrodes 5 and 6 are reversed, the electrode 5 being formed on the outer periphery thereof, while the electrode 6 is formed on the inner periphery thereof. The vibrator is formed from a quartz crystal plate which is obtained by rotating an X-cut plate around the X-axis by an angle $\alpha$ and further rotating the same by an angle $\beta$ around the Y' axis, which as hereinabove noted, is found by rotating the Y axis through a rotation $\alpha$. The angle $\alpha$ is predetermined to be in the range of 0° to 10°, and the angle $\beta$ is predetermined to be 50° to 70° or −50° to −70°. As is appreciated by a viewing of the electrodes illustrated in FIG. 4, since such a vibrator does not require side electrodes, the quartz crystal plate can be formed with an minimal thickness. Accordingly, such a tuning fork vibrator can be formed by a chemical processing method allowing the electrodes to be photoetched thereon, thereby resulting in a small-sized, extremely thin, flexural mode vibrator. Nevertheless, when the electrodes 5 and 6 have applied thereto positive and negative pulses, respectively, by an alternating-current signal, the electric fields generated in the tines produce components 7 and 8 across the electrodes and transverse components 9 and 10 in the direction of the electrical axis X, causing the necessary stress to generate a symmetrical flexural vibration in the tuning fork in the manner discussed above. Nevertheless, because the net transverse field components 9 and 10 are small in comparison to the field components 7 and 8 across the electrodes, the stress component along the X-axis is obtained by multiplying the strength of the fields between the electrodes by cosine $\beta$, thereby significantly increasing the tuning fork vibrator's dynamic impedance. The increase in dynamic impedance is inversely proportional to cosine $^2 \beta$, as has been determined by experimental calculations. Thus, when $\beta$ is 70° for an X-cut plate, the field across the electrodes is 8.5 times stronger than the transverse stress fields. Similarly, when $\beta$ is 75°, the field across the electrodes is 15 times greater, and when $\beta$ equals 90°, the field across the electrodes is infinite. Moreover, the temperature-resonance frequency characteristic substantially increases in accordance with the corresponding increase in the angle $\beta$, thereby limiting the flexion-point temperature to a rather low value because the angle $\beta$ is generally predetermined to the 70° or less in order to keep the dynamic impedance as low as possible. Thus, an NT-cut flexural-mode quartz crystal vibrator as illustrated in FIGS. 3 and 4 is not suitable for use in electronic timepieces because the dynamic impedance thereof is too high and the flexion-point temperature at which the temperature-resonance frequency is determined is too low, thus making it impossible to utilize the reduced size and mass-production advantages which inure to such a photo-etching process.

From the foregoing it is appreciated that a conventional +5° X-cut quartz crystal vibrator has the advantage that its dynamic impedance is low and the flexion-point temperature of its temperature-resonance frequency characteristic is high and the disadvantage that size reduction is impossible due to the side electrodes and the inability to chemically process same. On the other hand, the conventional NT-cut vibrator, although providing for a thin chemically processed vibrator, is disadvantageous in view of its high dynamic impedance and low flexion-point temperature. In the prior art, +5° X-cut and NT-cut quartz crystal plate vibrators have been regarded as entirely different types of flexural mode vibrators because the method of applying electric fields thereto is so different. Nevertheless, a comparison of the cutting angles of both types indicates that the cutting methods thereof are almost equivalent. Namely, the difference in the cutting angle is small such that the angle $\beta$ of +5° X-cut and NT-cut crystals is no more than 90°, and 50° to 70° or −50° to −70°, respectively. By combining features of both, the vibrators in accordance with the invention described below achieves the advantages of both types of vibrators.

Figure 5:
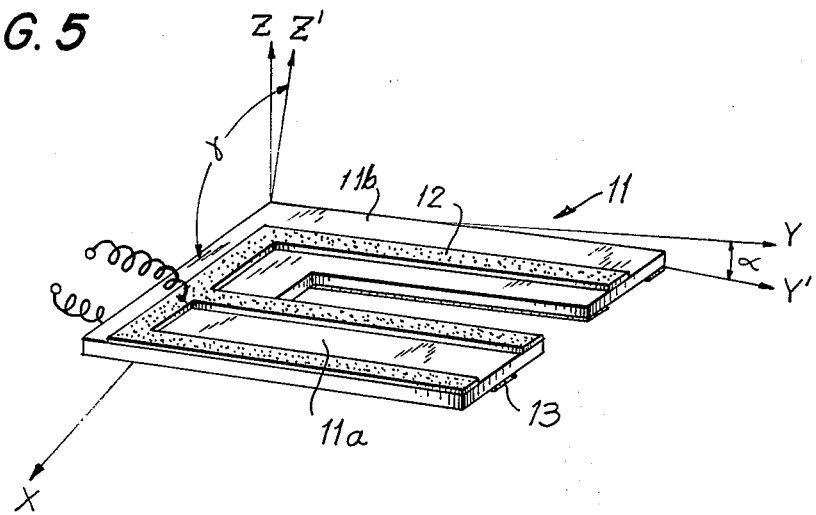
FIG. 5 is a perspective view of a flexural mode quartz crystal vibrator constructed in accordance with the instant invention.
Figure 6:
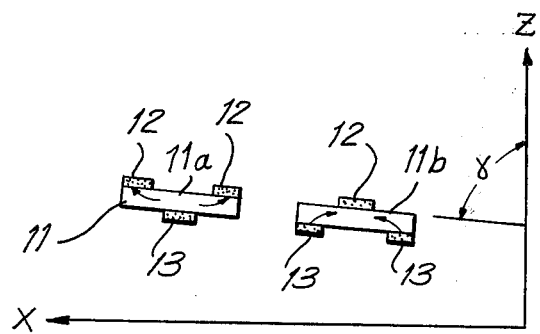
FIG. 6 is a sectional view of the quartz crystal vibrator depicted in FIG. 5.

Reference is now made to FIG. 5, wherein a tuning fork flexural-mode quartz crystal vibrator 11 is constructed in accordance with the instant invention, and to FIG. 6, wherein the electrode configuration thereof is illustrated in crosssection. As is illustrated in FIG. 5, the angle $\alpha$ is set at 0° in order to simplify the illustration. Accordingly, the quartz crystal plate has a front surface with electrode 12 disposed thereon and a back surface with electrodes 13 disposed thereon. The quartz crystal plate is formed by rotating an X-cut plate around the X axis by an angle $\alpha$ and then further rotating same by an angle $\gamma$ around the Y' axis in the same manner as discussed above. The angle $\alpha$ is predetermined to equal 0° to 10°, and the angle $\gamma$ is predetermined to equal 70° to 90° or −70° to −90° to thereby provide an advantageous temperature characteristic even though the angle $\gamma$ would be the same for an NT-cut quartz crystal vibrator.

Electrodes 12 are disposed on the front surface as illustrated in FIGS. 5 and 6, so that electrodes 12 are peripherally disposed around a first tine 11a and centrally disposed on the other tine 11b. Similarly, electrodes 13 are formed on the back surface so that electrodes are peripherally disposed on the tine 11b and centrally disposed on tine 11a. Accordingly, as depicted in FIG. 6, the electrodes on the tines, which comprise the vibratory part of the vibrator, have electrodes on both the front and back opposed surfaces which do not overlap with respect to each other at any longitudinal position thereof. In operation, when electrodes 12 and 13 have applied thereto positive and negative voltages, respectively, by an alternating current signal, electric fields are generated in the tines as illustrated by the curved arrows depicted in FIG. 6. As the generated stress has reverse directions at the inner and outer sides of the tines, a symmetrical flexural vibration is effected in the tuning fork vibrator. Further, the transverse electric fields in the X-axis direction are considerably larger than those generated in the prior art embodiments. Nevertheless, the dynamic impedance of the quartz crystal vibrator when compared to the prior art NT-cut is considerably lower. More significantly, by utilizing such a configuration, no electrodes are disposed on the sides of the vibrator, thereby allowing the quartz crystal plate to have a thickness of 0.5 mm or less. Finally, a photoetching technique can be utilized once the thin plate is cut into a tuning fork shape to form the electrodes, further reducing the size of the vibrator.

If a chemical forming process such as photo-etching is utilized after the quartz crystal thin plate is cut into a tuning fork shape to form the electrodes, the electrode configuration causes the vibrator to admit of a more efficient operation. Accordingly, a chemical processing method wherein chrome is deposited on both surfaces of a thin quartz crystal plate and then a gold layer is further deposited on the chrome layer, is utilized to form the electrodes on the quartz crystal plate. The chrome reinforces the connection between the quartz crystal and the gold. Then a photo resist is applied to both surfaces, which surfaces are then exposed to light through a photo mask so that the photo resist maintains the plate in the shape of a vibrator. When the plate is steeped in etching liquid gold and then etching liquid chrome, and photo resist serves as an etching mask to leave the gold and chrome with the same external shape as the vibrator. Thereafter, the plate is steeped in a solution of hydrofluoric acid to form the quartz crystal into the vibrator's external shape with the gold and chrome serving as an etching mask. The vibrator is then completed by shaping the electrodes in the same manner as was utilized for the etching mask of the external shape of the vibrator. When a chemical processing method utilizing a photo-etching technique is applied to a conventional +5° X-cut flexural mode quartz crystal vibrator, the vibrator cannot be used because it is necessary to deposit a metallic substance on the side surface of the quartz crystal plate after it is shaped and finished. In contradistinction thereto, by utilizing the process hereinabove discussed, with electrodes on only the opposed surfaces, the electrodes are not needed on the side surfaces, and a very thin quartz crystal plate is thereby realized.

In accordance with the above noted forming process, a further embodiment is depicted in FIGS. 7a and 7b. In FIG. 7a a top surface of a tuning fork flexural-mode quartz crystal vibrator 14 having electrodes 15 and 16 disposed thereon is depicted. The electrode 15 is peripherally disposed on the top surface of the one tine. The electrode 16 is centrally disposed on the other tine of the top surface of vibrator 14. A metal portion 18 is deposited on the top surface of each tine and is utilized to control the resonant frequency of the tuning fork vibrator by evaporating the metal to thereby change the mass thereof to adjust the resonant frequency thereof. Such conventional techniques as laser irradiation are utilized to evaporate the metal from the portion 18 of the tines.

The bottom surface of the tines includes electrodes 17, the electrodes 17 being peripherally disposed on the bottom surface of the tine that has electrode 16 centrally disposed on the top surface thereof, the other tine's bottom surface having electrode 17 disposed on the center portion thereof, the top surface of said other tine having electrode 15 peripherally disposed thereon. Accordingly, the electrodes do not overlap on the vibratory portion of the vibrator.

A metallic film 19 is deposited on the bottom surface of the tuning fork to allow the nonvibratory base portion thereof to be secured to a block holder. By utilizing such a block holder, the securing metallic film 19 can be formed at the same time that the electrodes are photo-etched on the top surface of the cut crystal plate. Because the metallic securing film 19 is disposed on the nonvibratory base portion of the tuning fork, it does not affect the electric field applied to the vibrator, even through it causes an increase in the inter-electrode capacitance of the vibrator.

It is noted that the use of non-overlapping electrodes is equally suited for use with a free-free-bar flexural mode crystal vibrator as depicted in FIGS. 8a, 8b and FIG. 9. The free-free-bar vibrator 20 has electrodes 21 and 22 peripherally disposed on the longitudinal sides of the top surface of the crystal plate and electrode 23 centrally disposed on the bottom surface of the crystal plate. Accordingly, the electrodes do not overlap. Vibration of the vibrator 20 is achieved in the same manner as the tuning fork vibrators hereinabove discussed, the same operational benefits inuring to a free-free-bar vibrator having non-overlapping electrodes.

As discussed above, the instant invention provides the benefits which inure to a conventional +5° X-cut and NT-cut quartz crystal plate by providing a new way of applying the electric field to the vibrator which is characterized by the lowering of the dynamic impedance while maintaining the flexion-point temperature near normal operating temperatures. Furthermore, because the instant invention eliminates the need for electrodes on the side surfaces of the vibrator plate, not only can a chemical processing method be utilized to construct the instant invention, but the resulting quartz crystal vibrator has a diminished thickness to render same particularly suitable in an electronic timepiece. Moreover, by the forming process hereinabove discussed, the vibrator can be supported by a direct adhesion to a support member, thus rendering such a vibrator suitable for mass production, the same vibrator being particularly adapted to have a two-terminal, three-terminal or a filter configuration by changing the couplings of the electrodes.

It will thus be seen that the objects set forth above, among those made apparent from the preceding description, are efficiently attained and, since certain changes may be made in the above construction without departing from the spirit and scope of the invention, it is intended that all matter contained in the above description or shown in the accompanying drawings shall be interpreted as illustrative and not in a limiting sense.

It is also to be understood that the following claims are intended to cover all of the generic and specific features of the invention herein described, and all statements of the scope of the invention which, as a matter of language, might be said to fall therebetween.

What is claimed is:

1. A flexural-mode quartz crystal vibrator comprising an elongated X-cut quartz crystal plate having at least one elongated vibratory portion including first and second opposed substantially planar surfaces and first elongated electrodes disposed on said first surface and adapted to be referenced to a potential having a first polarity and a further elongated electrode adapted to be referenced to a potential having a polarity opposite to said first electrodes and disposed on said second surface so that at least the portion of the respective electrodes on said vibratory portion are positioned on the respective surfaces out of overlapping relation.

2. A flexural-mode quartz crystal vibrator as claimed in claim 1, wherein the thickness of said plate between said opposed surfaces is no greater than 0.5 mm.

3. A flexural-mode quartz crystal vibrator as claimed in claim 1, wherein said plate electrodes are photo-etched on the surface thereof.

4. A flexural-mode quartz crystal vibrator as claimed in claim 1, wherein said first electrodes are respectively disposed along at least elongated portions of the periphery of said first opposed surface of said crystal plate and said second electrode is centrally disposed on said second opposed surface to effect said non-overlapping relationship.

5. A flexural-mode quartz crystal vibrator as claimed in claim 1, wherein said vibrator is a tuning fork vibrator having two elongated vibratory portions defining first and second vibratory tines, said first electrodes being peripherally disposed on said first opposed surface of said first tine and centrally disposed on said first surface of said second tine, said second electrodes being centrally disposed on the second surface of said first tine and peripherally disposed on the second surface of said second tine, to thereby effect said non-overlapping relationship on each tine.

6. A flexural-mode quartz crystal vibrator as claimed in claim 1, wherein said second opposed surface includes a metallic thin film on a portion thereof which is non-vibratory, said film providing the means for mounting said quartz crystal vibrator.

7. A flexural-mode quartz crystal vibrator as claimed in claim 1, wherein said electrodes on said first surface at the end of said tines is adapted to be removed so as to allow the mass thereof to be changed to effect a tuning of the vibrator.

8. A flexural-mode quartz crystal vibrator comprising a cut quartz crystal plate, said plate being X-cut and having X, Y and Z electrical, mechanical and optical axes defining a Y' axis in said X-axis plane, said X-cut plate being further rotated about said Y' axis by 70° to 90° or −70° to −90°, said cut quartz crystal plate defining a flexural mode quartz crystal vibrator having at least one elongated vibratory portion including first and second opposed substantially planar surfaces and first elongated electrodes disposed on said first surface, said first electrode being adapted to be referenced to a first polarity potential, and a further elongated electrode adapted to be referenced to a potential having a polarity opposite to the polarity of said first electrodes and disposed on said second surface so that the portion of the respective electrodes on said vibratory portion are positioned on the respective surfaces out of overlapping relation.

9. A flexural-mode quartz crystal vibrator as claimed in claim 8, wherein said first electrodes are disposed along at least a portion of the periphery of said first opposed surface of said crystal plate and said second electrode is centrally disposed on said second opposed surface to effect said nonoverlapping relationship.

10. A flexural-mode quartz crystal vibrator as claimed in claim 8, wherein said vibrator is a tuning fork vibrator having two elongated vibratory portions defining first and second vibratory tines, said first electrodes being peripherally disposed on said first opposed surface of said first tine and centrally disposed on said first surface of said second tine, said second electrodes being centrally disposed on the second surface of said first tine and peripherally disposed on the second surface of said second tine, to thereby effect said non-overlapping relationship on each tine.

* * * * *